(12) United States Patent
Kallfelz

(10) Patent No.: US 11,543,459 B2
(45) Date of Patent: Jan. 3, 2023

(54) METHOD FOR TESTING BATTERIES

(71) Applicant: Battery Technology Holdings LLC, Jamestown, RI (US)

(72) Inventor: Andrew F Kallfelz, Jamestown, RI (US)

(73) Assignee: Battery Technolgy Holdings LLC, Jamestown, RI (US)

( * ) Notice: Subject to any disclaimer, the term of this patent is extended or adjusted under 35 U.S.C. 154(b) by 34 days.

(21) Appl. No.: 17/300,166

(22) Filed: Apr. 8, 2021

(65) Prior Publication Data

US 2022/0326309 A1    Oct. 13, 2022

(51) Int. Cl.
| | | |
|---|---|---|
| *G01R 31/388* | (2019.01) | |
| *G01R 31/3828* | (2019.01) | |
| *G01R 31/385* | (2019.01) | |
| *G01R 31/392* | (2019.01) | |
| *H02J 7/18* | (2006.01) | |
| *G01R 31/371* | (2019.01) | |
| *G01R 31/00* | (2006.01) | |

(52) U.S. Cl.
CPC ......... *G01R 31/388* (2019.01); *G01R 31/371* (2019.01); *G01R 31/386* (2019.01); *G01R 31/3828* (2019.01); *G01R 31/392* (2019.01); *H02J 7/18* (2013.01); *G01R 31/007* (2013.01)

(58) Field of Classification Search
None
See application file for complete search history.

(56) References Cited

U.S. PATENT DOCUMENTS

| | | | |
|---|---|---|---|
| 3,873,911 | A | 3/1975 | Champlin |
| 5,744,962 | A | 4/1998 | Alber |
| 6,704,629 | B2 | 3/2004 | Huang |
| 7,212,006 | B2 | 5/2007 | Huang |
| 9,857,430 | B2 | 1/2018 | Kallfelz et al. |
| 2005/0282065 | A1* | 12/2005 | Kubo ................ H02J 7/007194 429/62 |
| 2014/0374475 | A1* | 12/2014 | Kallfelz ............ H01M 10/4285 235/375 |

* cited by examiner

*Primary Examiner* — Jas A Sanghera
(74) *Attorney, Agent, or Firm* — Michael de Angeli

(57) ABSTRACT

When a battery is insufficiently charged to allow ohmic testing of its condition, a charging source is connected to the battery, and a charge-acceptance test is performed to determine whether the battery is simply discharged but otherwise usable or beyond its useful service life.

21 Claims, 4 Drawing Sheets

METHOD FOR TESTING BATTERIES

FIELD OF THE INVENTION

This invention relates to testing of batteries, specifically for distinguishing between batteries that are simply discharged and would be useful if recharged from those which are beyond their useful lives.

BACKGROUND AND OBJECT OF THE INVENTION

Batteries are relied upon in many applications to provide electrical power for critical tasks. One typical use is of lead-acid batteries for starting the engine and providing auxiliary power in an automobile. The invention will be discussed in this context, though it is not limited to lead-acid batteries, nor to automotive applications.

The ability of any given battery to provide sufficient electrical power to accomplish specific tasks is not stable. A battery's ability to provide power will increase with increasing temperature and state of charge and will conversely decrease with decreasing temperature and state of charge. Over time and numerous charge/discharge cycles, a battery will lose its ability to store and deliver electrical energy.

To determine whether a battery is able to produce the required electrical energy for a task, a wide variety of tests have been developed. Some test methods require long periods of time and include "invasive" techniques, involving drawing significant power from the battery, which can cause some damage to the battery. Other methods are less invasive and more rapid, but have accuracy that is limited in some battery states.

A commonly used battery test method in automotive battery applications is ohmic testing. Exemplary ohmic battery testing methods are described in U.S. Pat. Nos. 6,704,629 and 7,212,006 to Huang, U.S. Pat. No. 5,744,962 to Alber, U.S. Pat. No. 3,873,911 to Champlin, U.S. Pat. No. 9,857,430 to the present inventor and another, and many others.

Ohmic testing involves measuring the internal resistance of the battery and comparing the measured value to an expected value for the battery. As a battery ages, the internal resistance increases, and this increase is correlated with a decrease in charge and discharge performance. Based on this consistent observation, measured internal resistance can be used to estimate battery health with acceptable accuracy. Ohmic test equipment is relatively inexpensive and portable, and the test is rapid and does not disturb the battery. Unfortunately, ohmic testing has some limitations, primarily driven by the fact that the internal resistance of a battery also increases as the battery is discharged, and its resistance decreases as the battery becomes more fully charged. Such reversable changes to internal resistance can be confused with irreversible changes in internal resistance due to aging. Accordingly, it becomes problematic to determine if a particular level of internal resistance is the result of aging (likely irreversible) or discharge (reversable). As a result, it is very challenging to use ohmic testing to accurately diagnose the state of health of discharged batteries, that is, to differentiate between a battery which is merely discharged and one which is so permanently mechanically or electrochemically impaired that it cannot be expected to serve its purpose.

While many techniques are used to improve diagnostic accuracy of ohmic testing of discharged batteries, none have been particularly effective. As a result, for deeply discharged batteries, ohmic testing is not useful, and the only remedy is to charge the battery before attempting an ohmic test. Charging a battery requires equipment and time, and unfortunately this is not practical in many situations such as in a roadside service situation, where a motorist is stranded and does not have the patience or equipment to charge the battery before being able to diagnose it. This unsatisfactory situation typically results in one of three possible outcomes. One is that a diagnostic tester will basically guess at the health of the discharged battery and provide an inaccurate "Replace" or "Continue to use" recommendation. Another outcome is that the motorist considers a "Charge and Retest" recommendation and decides to take the risk of leaving the discharged battery in the vehicle and, after jumpstarting, continues in the hope that the battery will recover while in the vehicle to a state of reliable use. A third outcome is that the motorist considers the "Charge and Retest" recommendation and concludes that the risk of a recurrence is too high and elects to replace the battery immediately, potentially replacing a perfectly good battery simply because its condition cannot be accurately known with the available information.

Therefore, there exists a need for a battery testing method that can distinguish between a battery that is merely discharged and one which is beyond its useful lifetime, and equipment for performing such testing, and to provide such is the object of the invention.

SUMMARY OF THE INVENTION

The invention described here resolves this situation by quickly evaluating the discharged battery's ability to accept charging current ("charge acceptance") after a short period of engine run time. Quickly evaluating the charge acceptance at this point in a test process adds critical information to the replace/continue to use decision. Crucial to this process is the idea that this evaluation is made quickly, in-situ, and can be made using the charging system of the vehicle itself; that is, an effective test can be made in the roadside service situation.

The present invention identifies batteries in a deeply discharged state where an accurate ohmic test cannot be made, and instead of requiring a substantial re-charge of the battery before re-testing, the invention quickly evaluates the battery's ability to accept charge (again, referred to as "charge acceptance") and makes a determination whether the battery is able to accept sufficient charge to practically recover to a reliable level of performance. This quick evaluation in-situ resolves the uncertainty presented to technicians and motorists and offers useful additional information to confidently and accurately make a replacement decision.

More particularly, a battery that has been deeply discharged for an extended period of time (perhaps a number of weeks, or a few months) may be challenging to charge because the lead sulfate tends to crystallize on the negative plates over time. This more crystalline form of lead sulfate is harder to reverse by charging than the "fresh" or amorphous lead sulfate that accumulates in real time as a battery is discharged. This reversal may be nearly impossible to achieve in a vehicle because the type of charging that a vehicle alternator is capable of, combined with typical driving behavior (short and infrequent intervals of driving) will never motivate a reversal of this type of sulfation. A reduced charge acceptance rare is symptomatic of such "hard sulfation." This type of sulfation may be correctable by applying a controlled overcharge, ideally while warming the battery, but this is likely never to occur in a vehicle. For this reason, the charge acceptance approach according to the invention is useful because it is capable of distinguishing conditions that are likely unrecoverable in the vehicle, though they might be recoverable if the battery was carefully managed during a dedicated charging process.

BRIEF DESCRIPTION OF THE DRAWINGS

The invention will be better understood if reference is made to the accompanying drawings, in which.

DESCRIPTION OF THE PREFERRED EMBODIMENTS

In the preferred embodiment, the current-measuring function provided according to the invention is provided in addition to the ohmic measurement and evaluation functions provided by the battery tester disclosed in U.S. Pat. No. 9,857,430 (the '430 patent") and the following description will be based on that embodiment. It is to be emphasized, however, that the invention is not so limited.

Figure 1:
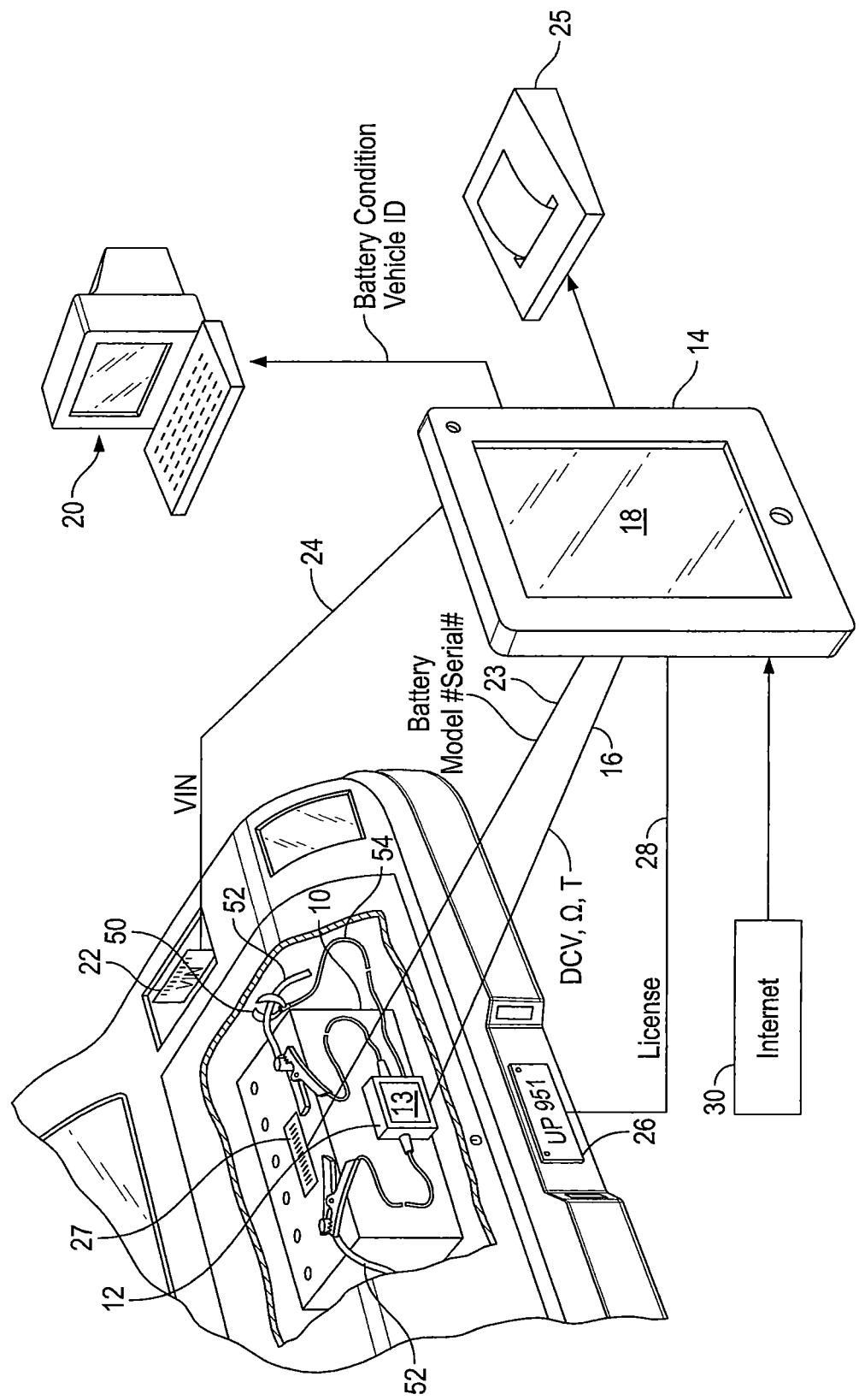
FIG. 1 shows schematically the connection of a battery tester with distributed measurement and analytical functions, as in U.S. Pat. No. 9,857,430, and providing additional current-measuring functionality according to the present invention.
Figure 2:
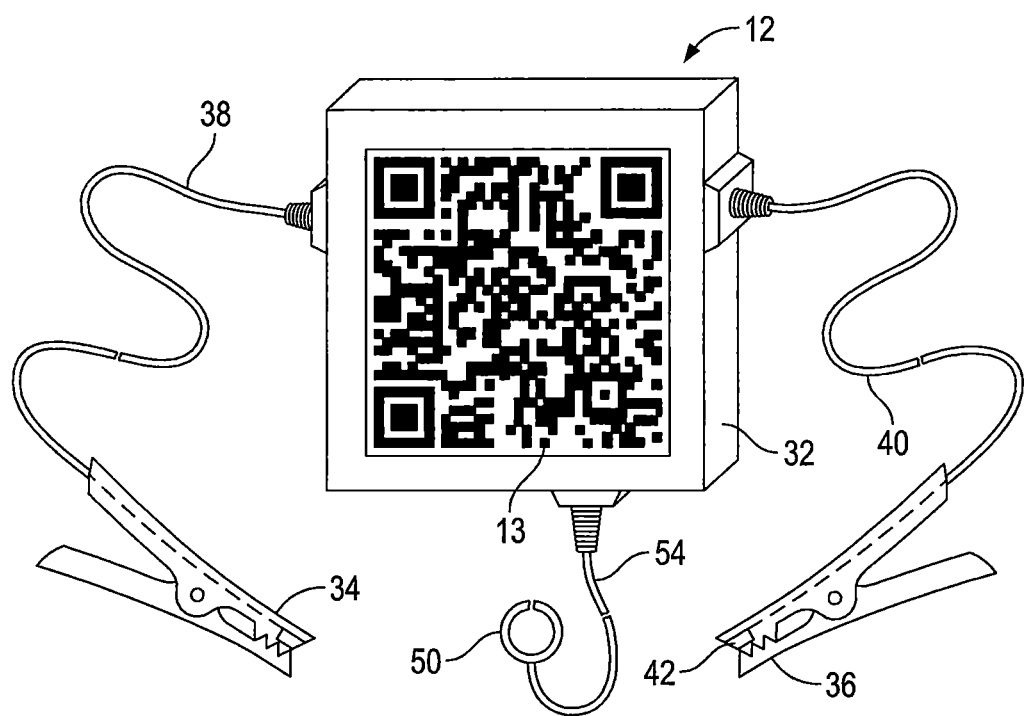
FIG. 2 shows the simplified battery testing device illustrating a typical QR code, readable by a remote smart device.
Figure 3:
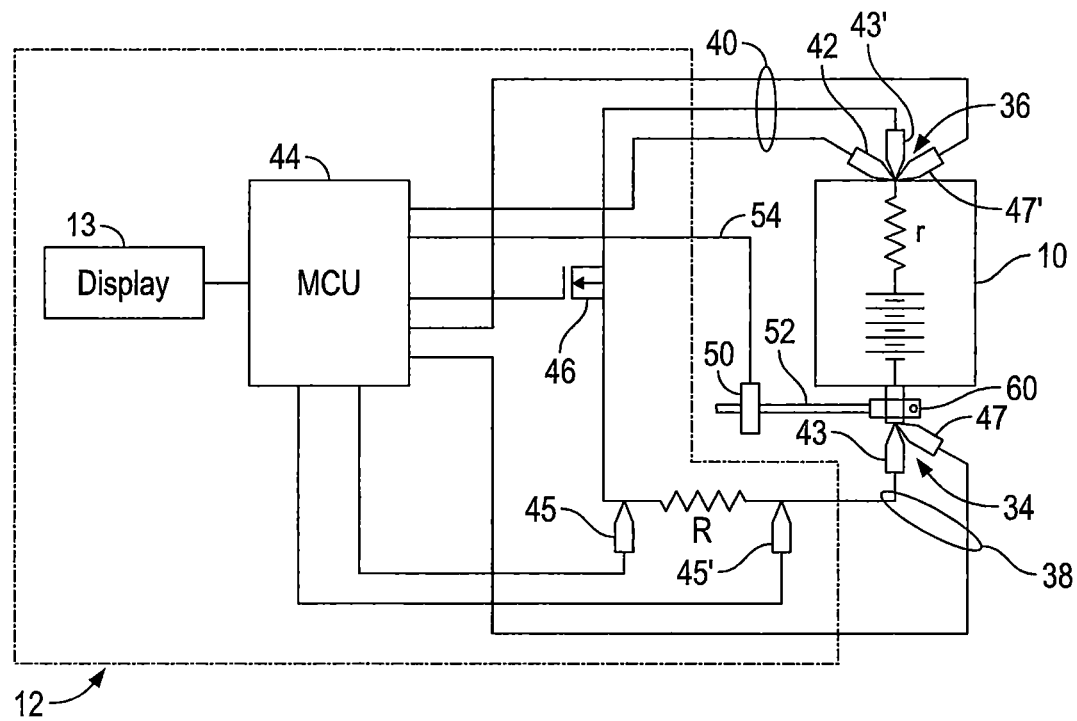
FIG. 3 shows a block diagram of the components of the simplified battery testing device.

Thus, FIGS. 1-3 and the following description thereof are taken more or less directly from the '430 patent, with additions as needed to implement the present invention.

As mentioned above, FIG. 1 shows an overall view of a testing system with distributed measurement and analytical functions according to the invention of the '430 patent.

The basic function of measuring battery parameters, typically the open-circuit voltage (OCV), ohmic value and temperature of a battery 10 is carried out by a simplified battery testing device 12, when "powered-up" by being connected to the battery 10. The technique employed for measuring the ohmic value may be generally as described in the Huang patents referenced above, and as summarized below, or otherwise. Values other than those mentioned may also be measured, as noted above.

According to one embodiment of the present invention, alternatives being discussed below, after these parameters are measured, and when it is not possible to determine whether the battery is simply discharged or is past its useful life, the engine is started, typically by jumpstarting, and the charging current is measured.

After the tests supported by the simplified battery testing device 12 have been performed, as above, the simplified battery testing device 12 then transmits this raw battery parameter data to a smart device 14, as indicated at 16.

Such smart devices 14, typically including the devices known colloquially as smart phones or tablet computers, and including therein other devices with the capabilities required, have several built-in features that are employed in implementation of the invention. For example, such smart devices include image sensors, which are connected to image processing circuitry and software such that they can decode symbols such as a so-called QR code, yielding an alphanumeric string of letters and numbers. These smart devices are also provided with memory and significant processing power, with the ability to download software (commonly referred to as an "app", for "application") adapting the device to a new use, and with the ability to communicate in any of several ways. Thus, in order to adapt a preexisting smart device for use in connection with the present invention, one simply need download appropriate software, for example, software implementing the steps discussed below.

As mentioned above, the raw data can be transmitted from the simplified battery testing device 12 to the smart device 14 in any of several ways, including wired or radio connection. At present the preferred method is by way of display of an encoded version of the raw data on a screen 13 of the battery testing device 12, e.g., in the form of a QR code (see FIG. 2), and read therefrom by an image sensor or camera comprised by the smart device 14. The smart device 14, having been provided with battery context information such as the battery rating (for example, by user input via a touch screen 18), then analyzes the raw data according to a stored algorithm, and determines the battery condition.

The smart device 14 can be configured to optically capture a bar code 27 or other code on the battery 10 containing battery identifying information. Alternatively, the smart device 14 can use other methods of capturing battery identifying information from the battery. For example, the simplified testing device 12 can comprise an RFID receiver which can receive information from an RFID chip that is provided by the manufacturer as part of the battery 10. The information received from the RFID receiver in the simplified testing device 12 can be transmitted to the smart device 14 along with battery test information in any of the ways described herein. Once the battery identifying information is received, the smart device 14 is enabled to select specific battery context information for the particular battery being tested. The smart device 14 may be provisioned with a database of specific batteries and the corresponding context information for each, or the smart device 14 may communicate the battery identifying information to a remote web server as indicated at 30 where context information for that specific battery is available; the web server then returns the appropriate battery context information to the smart device 14 for calculation of battery condition results.

Optionally, the smart device 14 may transmit the battery condition data to a remote computer 20, e.g., to the service bay workorder system of a dealership or service center. In that case the smart device 14 will preferably also transmit vehicle identification data, such as the VIN, readable by the smart device from the label 22 provided on all vehicles, as indicated at 24, or the vehicle's license plate number 26, likewise readable by the smart device 14, and as indicated at 28. The battery condition data and other identifiers can alternatively or additionally be printed via printer 25. The vehicle will also comprise an engine, and the engine will drive an alternator to supply charging current to the battery 10, as well known to those of skill in the art.

As noted above, the smart device 14 will normally require battery context information, typically including battery type and the battery's nominal specifications, and the battery rating system to which the specifications refer, in order to perform its analysis. This information is normally printed on the battery label. The user can input this information directly, responsive to prompts displayed on the screen of the smart device. Alternatively, the smart device may obtain this data by user input of a battery identification, such as the part number, followed by downloading the battery's specification from the internet, e.g., from the battery manufacturer's web site, as indicated at 30. The smart device 14 may also be enabled to read the battery's identification from a bar code, RFID memory device or like identifier 27 on the battery 10, where provided, and likewise obtain its nominal specifications and other context information from a database maintained by the web server if the relevant specifications are not already contained in the RFID information or bar code.

As noted above, in most cases, batteries are grouped into major "type" categories—e.g., "wet", "VRLA" or maintenance-free, and absorbed glass mat ("AGM")—that exhibit common ohmic behavior. This has been advantageous because the user can reasonably expect to determine the general type of a particular battery by inspection. The battery tester, or in the preferred embodiment of this invention, the smart device 14, is typically provided with specific algorithmic values that are generically accurate for testing each type of battery. However, it has been found that there are differences in ohmic performance of batteries within a type category, notably the AGM type. If a specific battery can be tested using specific algorithmic values appropriate for that model, testing accuracy will be improved. By enabling the smart device to specifically identify a battery as described above, the smart device can download not only battery specifications, but also particular algorithmic parameters for that specific battery model. Downloadable information might also include a specific battery type factor, battery warranty period, and other useful attributes that cannot be readily observed.

According to one embodiment of the present invention, current-measuring capability is added by provision of a clamp-on inductive sensor 50, adapted to fit over a battery cable 52 and connected to simplified battery testing device 12 by a wire 54 carrying a signal indicative of the current flowing into the battery while the engine of the vehicle is running and the alternator is providing charging current. However, other sources of charging current and current measurement devices are within the scope of the invention. In particular, a separate ammeter may be preferred.

FIG. 2 shows a schematic view of the simplified battery testing device 12 according to the invention. As illustrated, device 12 comprises a central unit 32, which contains the circuitry necessary to carry out the functions described, as discussed in more detail below in connection with FIG. 3, a display 13, and positive and negative spring clamps 34 and 36 for being conveniently attached to the poles of a battery 10, as illustrated in FIG. 1. Clamps 34 and 36 are connected to the internal circuitry of device 12 by cables 38 and 40, as conventional. Clamps 34 and 36 and their associated cables 38 and 40 may implement so-called Kelvin clamps, as commonly used, comprising separate conductors for signal-level currents, such as the voltage across the battery 10, and heavier currents, such as the current drawn when a load resistor is connected across the battery in order to measure its internal resistance. See the Huang patents referenced above. One of clamps 34 and 36 may include a temperature sensor 42 for measuring the temperature of the battery 10.

According to one aspect of the present invention, the battery testing device 12 also includes a current sensor 50, which as illustrated may be of the clamp-on type adapted to fit over either of the cables 52 connecting the battery to the electrical system of the vehicle. The current signal is provided to the testing device 12 by wire 54. Again, however, a separate ammeter may be preferred.

FIG. 3 shows a block diagram of the components of the simplified battery testing device 12 of the invention. These include a microprocessor control unit (MCU) 44, display 13, cables 38 and 40 connecting the MCU 44 to the battery 10 to be tested, and a transistor switch 46. As noted above, cables 38 and 40 may terminate in Kelvin clamps 34 and 36 respectively. Again, current sensor 50 is connected to MCU 44 by wire 54.

The '430 patent describes the steps in the ohmic testing process carried out by the simplified battery testing device 12 when it is connected to a battery. For completeness, the key steps are summarized here as follows.

In essence, testing device 12 makes measurements of fundamental parameters of the battery 10. As discussed above, these measurements will typically include an initial measurement of the open-circuit voltage (OCV) across the battery. An "ohmic" value for the internal resistance r of a battery 10 then can be derived by measuring the voltage $V_B$ (equivalent to OCV) across the battery, employing contacts 47 and 47', connecting a load of known resistance R across the battery for a short period of time by closing switch 46 so that a single short pulse of large current I is drawn from the battery, via contacts 43 and 43', and measuring the voltage $V_R$ across the load R employing contacts 45 and 45', while again measuring the voltage $V_B$ across the battery. The current I drawn from the battery is then calculated by $I=V_R$ R, and the internal resistance r of the battery calculated by $r=V_B-V_B'/I$. Again, see the Huang patents referenced above, noting that the invention is not thus limited. The result is values for the OCV and internal resistance; the temperature of the battery 10 may also be measured, employing contact 42, as noted.

Figure 4:
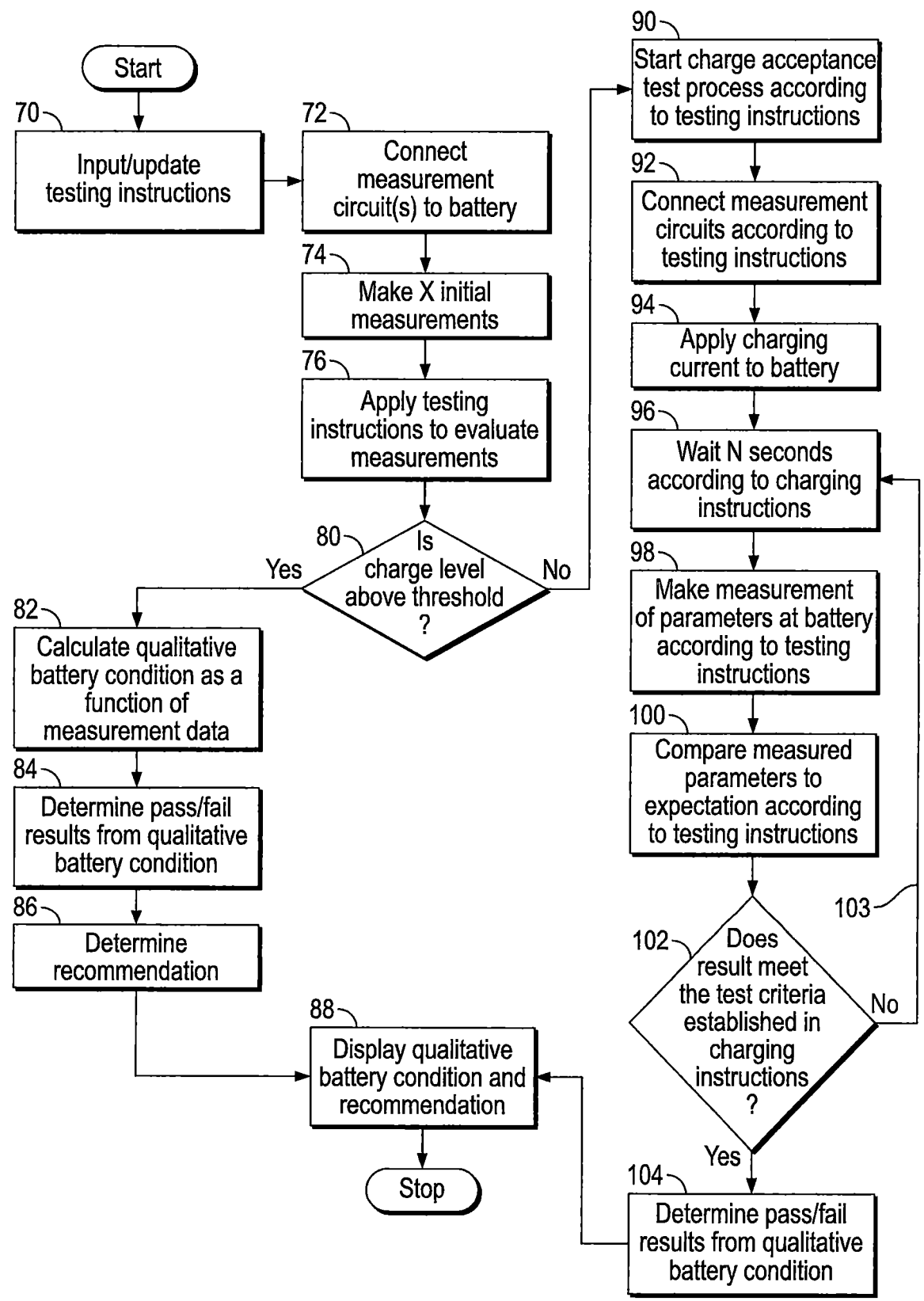
FIG. 4 shows a flow diagram of the steps taken in a typical battery test sequence.

As discussed, under certain circumstances, especially when the battery is discharged, this method of measuring the internal resistance is inadequate to distinguish between a battery that is merely discharged and one which is beyond its useful lifetime. The present invention addresses this problem. FIG. 4 shows the principal steps in one embodiment of the method of the invention.

The process begins at step 70, where the smart device has previously had inputted or is now updated with the testing algorithm. The testing device 12 is connected to the battery at 72, and several measurements are taken at 74. (Again, the invention is described as implemented using the improved device based on that shown in the '430 patent, but is not so limited.) The results are evaluated as described above at 76. At 80, it is determined whether the battery is adequately charged to be accurately evaluated. If so, the process goes to step 82, where the battery condition is calculated, to step 84, where it is determined whether the battery passes or fails, and to step 86 where a recommendation is made, that is, to replace the battery or not. Finally, this result is displayed at 88.

On the other hand, if it is determined in step 80 that the battery was not sufficiently charged to be accurately evaluated, the process goes to step 90 where the charge acceptance test provided according to the invention commences. At step 92, the current-measuring sensor is connected; typically, this will be the clamp-on inductive sensor discussed above, but other current-measuring sensors are known to the art. It is of course within the invention to employ a separate ammeter, not integrated with the simplified tester 12, to measure the charging current. The user would typically input the current measurement to the smart device.

Charging current is applied at step 94; again, typically this will be done by jump-starting the engine of the vehicle, causing the alternator to generate charging current. Other sources of charging current may be employed. After a delay of some seconds, as indicated at 96, current and voltage measurements are made at 98. These steps can be repeated several times, as indicated at 103, for increased accuracy. Next, at 100 the measured current and voltage measurements are compared to expected values, which may be determined in a manner discussed below and illustrated by the graph of FIG. 5. Finally, at 102, the result is compared to established test criteria—that is, it is determined whether the battery is accepting charging current of at least a minimum value—this result is evaluated at 104, and the result displayed at 88.

Thus, in the preferred embodiment, an ohmic test is first attempted. If the results are determined to be unreliable due to the level of discharge (that is, the state of charge ("SOC") of the battery, which is simply a function of the open-circuit voltage measured as compared to the nominal voltage of the battery) the Charge Acceptance test is offered. However, it is within the scope of the invention to first measure SOC and immediately decide to use the Charge Acceptance test. The order is not a key feature of the invention. What is important is that the Charge Acceptance test is a useful test in the case of a discharged battery where the ohmic test is not reliable. They are not mutually exclusive. One could perform a charge acceptance test and an ohmic test on a discharged battery, and choose to rely on the results of one or the other based on the SOC of the battery. Or one could decide to perform only the Charge Acceptance test, or the ohmic test depending on SOC. On a battery that is sufficiently charged, the ohmic test is quite reliable, and the Charge Acceptance Test is not as useful.

Charge acceptance testing techniques have been used under controlled conditions to evaluate the health of a battery; for example, some dedicated battery "bench chargers" perform pre-charge evaluations that determine whether a battery is safe for continued charging. However, this approach doesn't solve the problem at the roadside or in a service lane situation where rapid in-situ information is needed. It is of relatively little value to know that a battery can be charged at some minimal rate in a controlled environment with a dedicated charging source. In the application of field-testing batteries to make accurate real-time decisions about battery replacement, it is more critical to evaluate the battery's ability to be charged in the application it is required to serve. If a battery cannot be effectively charged in the vehicle, it is of little value to know that the battery can be charged if removed from the vehicle or placed in a controlled environment and charged with specialty battery charging equipment. As a practical matter, if the battery cannot be charged at a reasonable rate using the vehicle alternator, the battery is likely not suitably reliable to remain in service in that vehicle.

The determination of the level of charge acceptance that is practically sufficient to allow continued use of a given battery can vary from market to market, and also based on the policy of the battery supplier. For example, in implementing a charge acceptance test, some battery service operators may feel that a high standard of charge acceptance is appropriate because users are often not in a situation where extended driving would likely allow for sufficient charging to recover the battery. In other situations, where vehicles are subject to regular professional maintenance, such as in fleet operations, a lower standard of charge acceptance is appropriate because batteries can be subsequently charged with professional shop equipment.

Most diagnostic equipment and methods use relatively fixed input evaluation criteria and output determinations. In the case of charge acceptance methods, having such fixed input evaluation criteria and output determinations would unduly limit the flexibility of adaption of the method to different practical or policy considerations, and would also limit the adaptability of the method to accommodate a high degree of variation of factors that impact charging currents of a battery under test in a field (in service) application. Besides policy or practical considerations that motivate low or high thresholds for passing or failing charge acceptance tests, other factors that affect charge acceptance include the temperature of the battery, the size of the battery, the maximal capacity of the charging source, the proper function of the charging source, rpm of the engine or alternator, and the voltage measured at the battery. A method for evaluating the charge acceptance of a battery should be adaptable to all of these considerations. Accordingly, and as will be described further below, the test apparatus comprising a dedicated tester communicating test data to a smart device for analysis can be customized to a particular organization's or individual user's preferred criteria by downloading suitable software to the smart device.

As described above, in a typical embodiment of the invention, a typical battery test device such as an ohmic battery tester is used. This device is attached to the positive and negative terminals of a battery under test. This device applies a signal to the battery under test and measures the internal resistance of the battery, as well as measuring the voltage between the terminals of the battery, and also the temperature of one or both of the battery terminals.

Separately, information about the battery is collected to establish an expectation of how the battery should perform. This information includes battery performance specifications, battery size, battery construction type, and nominal battery voltage. This information is used to establish a baseline of expected ohmic performance of the battery.

The measured ohmic information along with temperature and voltage are compared with the expected ohmic performance determined from the information collected about the battery. If the state of charge of the battery is sufficiently high to result in a likely accurate battery health diagnosis, the test will end, and the operator will be advised of the battery condition. If the state of charge of the battery is too low for an accurate ohmic comparison, a further evaluation is advised. In this case additional battery-related parameters related to the battery's ability to accept charging current are collected and evaluated.

The performance of charge acceptance testing is not limited to prior testing with an ohmic test method. Charge acceptance (CA) testing as described herein can be used to quickly evaluate any battery that is in a discharged condition. The description of CA in conjunction with ohmic testing herein is only exemplary.

In the application described, the charge acceptance test is performed by connecting the battery to a charging source, and then initiating a charging process while monitoring the net charging current and the voltage at the battery. Typically, the vehicle will be jump-started, and its alternator used to supply charging current. After some period of time, e.g., five or ten seconds, the instantaneous current and voltage are measured. Additional measurements of current and voltage are made at further intervals over time while the charging current is applied. These measurements can be captured manually, for example by viewing the display of a digital ammeter and a digital voltmeter. Alternatively, these measurements can be made automatically by sampling the voltage and current at specified intervals using a dedicated tool that is connected to a digital data gathering device, as described above.

The gathered data is compared to a threshold expectation for charge acceptance and determined to be acceptable or not acceptable. Multiple data pairs of current and voltage measurements gathered over time intervals can each be compared to threshold expectations and together can be used to increase the confidence of the charge acceptance assessment.

The assessment of the charge acceptance of a battery measured in this way, and the expression of a recommendation as to replacement or continued use is not an absolute; rather, the charge acceptance of a battery must be considered in the context of the practical reality of the charging environment and use circumstances. It is possible that a discharged battery demonstrating a very low rate of charge acceptance can, with special care, be successfully charged and returned to a reasonable level of performance. For example, an otherwise healthy but completely discharged automobile battery that accepts only 1 ampere of charging current at 13.8V may be successfully charged over a long period of time, so that the battery may recover a normal level of performance. However, if that battery remains in the vehicle, charged only by the alternator that is measured to provide charging current at 1 A (a typical charge rate of a discharged battery in a vehicle will be between 20 and 100 A) and is exposed to only intermittent and short periods of charging from typical driving intervals, the battery is unlikely to recover to a condition that will lead to reliable performance. For this reason, the expected charge acceptance threshold must be adjusted to match the practical circumstances of the battery application.

Other circumstances that can influence the setting of the expected charge acceptance threshold include the risk tolerance to a system failure as a result of the battery not charging sufficiently before it must be used again. In the automotive example, this can be understood as the risk of not being able to start the vehicle again. Other factors may include warranty policy considerations of the battery supplier, or time and cost considerations of the battery service provider. For example, an emergency roadside service operator who is dispatched a long distance to diagnose a motorist's battery will have a motivation to ensure that a repeat call does not occur.

Accordingly, a significant aspect of this invention is the method of setting the threshold expectation such that a recommendation resulting from a charge acceptance test is appropriate for the practical and policy circumstances of the application.

The recommendation to a battery owner who has ready access to prolonged and effective charging resources, or who is not put at risk by a repeat battery failure, should be different from the recommendation to a battery owner who is not able to ensure prolonged charging of their battery, and who is at high risk if the battery is not sufficiently charged before its next use.

The present invention provides the capability of ready establishment of threshold expectations for charge acceptance that are determined appropriate for the circumstances.

In an exemplary embodiment, a battery test software application is loaded to a mobile device, such as a smart phone or tablet. The test application contains a stored algorithm and procedure and instructs the user to perform specific tasks to perform the described charge acceptance test. In the preferred embodiment, the user is instructed to attach a current measurement tool to the positive or negative terminal of the vehicle battery, and to attach a voltage measurement tool to measure the voltage at the battery terminals. These tools can be independent tools that display data for the user to monitor, or a dedicated tool can be connected to the battery and communicate measured data to a smart device running the test application in a wired or wireless (Bluetooth or WiFi, for example) method to provide direct communication of voltage and current data to the smart device and test application, again as described above.

Another method of transferring data between the voltage and current measurement tools and the smart device could be an optical method, such as infrared communication, or via image codes such as bar codes or QR codes that dynamically display data coded in an image, as in the '430 patent, referred to above. The smart device running the test application can use the camera of the smart device to receive this optical data. Next the user is instructed to begin applying a charging current to the battery. In this case, the charging current is applied by the alternator after the engine is started. The test application will be informed that the charging process has begun. Informing the test application that the charging process has begun can be done manually by the user, or can be detected by the test application by other inputs, such as monitoring a change in voltage or current as measured by the sensors and transferred to the test application using any of the above described methods.

The test application will instruct the user to enter, or the test application will automatically capture, one or more voltage and current value pairs at particular intervals. The collected voltage and current pairs will be compared by the test application to the threshold expectation. The test application will apply the stored algorithm which embodies the threshold expectation and after the completion of the process defined by the algorithm, the test application will respond with an outcome based on the comparison of the one or more voltage and current value pairs to the threshold expectation.

In the described example, voltage and current value pairs are evaluated against a threshold expectation. However, more or less data can also be used to make a charge acceptance evaluation. Current values only can be used. Alternatively, additional information such as temperature can also be included in the evaluation.

Many other characteristics of the battery under test and the environment may be inputted either manually or automatically to the test application and included as inputs to the algorithm as threshold expectations. These characteristics may include factors such as the temperature of the battery, the nominal voltage of the battery, the nominal electrical capacity of the battery (expressed as Ah, or CCA, or other industry standard ratings), the internal resistance of the battery, the type of vehicle, the size of the alternator, the rpm of the engine, the rpm of the alternator, the age of the battery, construction details of the battery, battery chemistry, and the battery rating system.

In one embodiment, the threshold expectation of acceptance is the following formula and decision logic:

$$A\text{calc} = (0.65 * C_t * R/10)/(1 + \log(-2*(v-14)));$$

Figure 5:
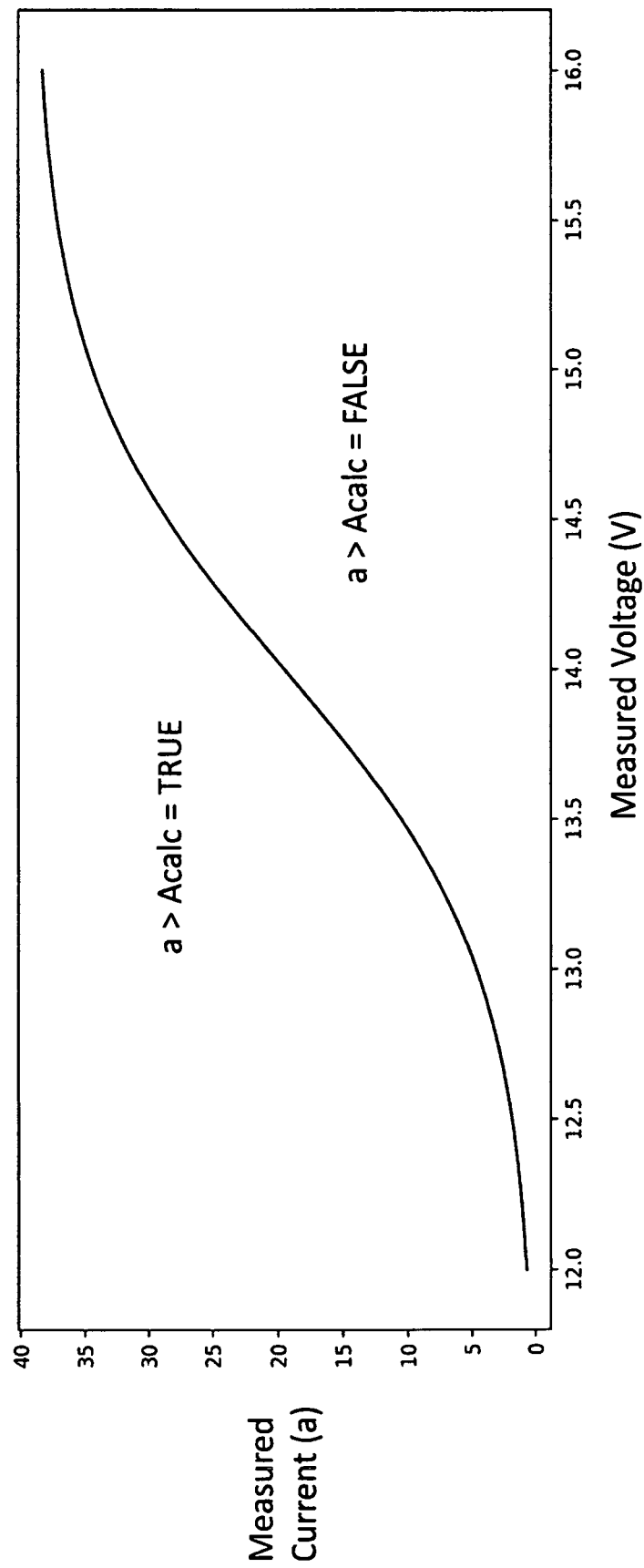
FIG. 5 shows a graph of a function that is used to compare the current measured in a charge acceptance test with a calculated minimum acceptable current acceptance value.

If (a>Acalc) then TRUE, else FALSE
Where:
a=measured current
Acalc=minimum threshold A value
R=battery nominal capacity, expressed in CCA
Ct=battery temperature coefficient
v=measured voltage A typical threshold function Acalc can be expressed as the curve shown in FIG. 5, for the case where R=600 and Ct=1, for the range of current values (Y axis) of zero to 40 amperes, and for the range of voltage values (X axis) of 12 to 16 volts.

For any measured pair of current and voltage values (an "(a,v) pair"), if the measured a is above the Acalc curve, the measured current is greater than the threshold and the charge acceptance is considered to exceed the target, and the result will be TRUE; that is, that the battery is capable of accepting adequate charge to be useful.

Multiple a,v pairs can be evaluated using the same curve to achieve greater confidence in the outcome. In a preferred embodiment, 4 (a,v) pairs that exceed the threshold (TRUE) are required to meet a "charge acceptance PASS" condition, while if 1 (a,v) pair doesn't exceed the Acalc value the (FALSE) result is returned and the "charge acceptance FAIL" is reported. Data pairs are collected and evaluated until one of the two conditions is met. When a condition is met, the routine is terminated, and the outcome for the determined condition is presented.

Multiple a,v pairs are useful to evaluate not only to achieve increased confidence in the answer but also to determine changes in voltage and the rate of charging over time. It is known that the charge acceptance rate changes over the time that the charge is applied. The direction and rate of change of charge acceptance over time can be indicative of battery condition. For example, detection of constant current but increasing voltage over time indicates a battery that is stable and charging normally. Rapidly increasing voltage and decreasing current over time can be indicative of a battery with an internal defect. A stable voltage, but slowly increasing current can be indicative of a battery that has been discharged for a long period of time and is slowly accepting a charge. Accordingly, the algorithm used to evaluate charge acceptance may include time to increase predictive accuracy of the outcome; that is, the equation used may be a function of time as well as the other measured parameters discussed above.

The Acalc function described above is just one of a large number of functions that might be used to evaluate charge acceptance. However, discussion of some features of this Acalc function is useful to understand how an effective charge acceptance threshold function can be developed.

For example, it has been found through examination of many vehicles that for a deeply discharged original equipment battery in a vehicle, the typical maximum charging current of a typical factory installed alternator is roughly approximately ⅟₁₀ of the size of the battery rating in CCA. In this example the factor R/10 is included to approximate the described relationship.

The Ct factor is a temperature coefficient. It is widely understood that battery temperature can have a significant impact on the chemical reactions that occur inside the battery during charge and discharge. If the battery temperature is measured to be very low (room temperature or 77 F is nominal), a temperature coefficient of less than 1 will be used as a factor to lower the charging expectation threshold.

The log expression with the v (voltage) variable expresses the expectation of charging current as a function of alternator output voltage. More specifically, the alternator output of many vehicles is controlled by a microprocessor or engine control unit (ECU). For many reasons an ECU will turn the alternator on or off, or control its rate of output. For example, auto manufacturers now commonly limit the alternator output upon a cold start, to limit the engine loading until the catalytic converter commonly employed to reduce noxious emissions can be warmed-up, as required to remove emissions. When the engine is running, the alternator is spinning but the output of the alternator is managed by an output of the ECU that energizes the field coil in the alternator. Because the ECU controls the output of the alternator it not possible to expect a particular output from the alternator at any specific time. For this reason, if the expected charging current is supplied by an alternator, it is useful to set the threshold current expectation as a function of the output voltage of the alternator as measured at the battery. If the alternator output is limited by the ECU, then the output voltage from the alternator and thus expected target current will be commensurately low. If the ECU is commanding full output from the alternator, then the voltage at the battery and charging current are expected to be higher.

The log function curve example of FIG. 5 approximates the expected charging current expected for a deeply discharged 12V nominal battery. At voltages near 12V very little charging current is expected, while at 16V the threshold charging current is expected to approximate the maximum charging capability of the alternator.

The final factor to consider in this example is an arbitrary "threshold" factor to approximate what percent of the expected charging current is considered to be the acceptable threshold. In the above example the factor 0.65 is used; that is, each point on the Acalc curve represents 65% of the expected design charging current at a given voltage. By comparison, a threshold factor of 1 would set the threshold to be at the ideal maximum design charging current. It would be expected that batteries and charging systems performing at their optimum would meet this threshold. For evaluating in-service batteries, a much more lenient threshold may be appropriate.

It will be appreciated that this exemplary threshold function is one of many possible functions that can be used to evaluate acceptable charging performance. For any function the various factors can be adjusted to approximate the application, and to set a more aggressive or lenient threshold. A different function may be appropriate for different charging sources. For example, a fixed DC power supply with known voltage and current limits might be used. In this case, a different threshold function not dependent on nominal battery size might be appropriate.

From the above description, it should be clear that a broad range of functions and input variables can be used to establish threshold functions for evaluating charge acceptance. It is not practical to develop a dedicated tool or test application for each and every different situation that requires a different charge acceptance testing approach. This would require a multitude of tools for each different set of conditions. Instead, the tool is made adaptable to be able to perform charge acceptance testing according to chosen criteria. In the preferred embodiment, where a smart device is employed to analyze test data, the test acceptance criteria are downloaded to the smart device.

The method of determining charge acceptance described above uses the alternator as the charging source. This is a particularly convenient method for testing vehicle batteries because it does not require the battery to be removed from the vehicle, or for an alternative charging source to be provided. However, other charging sources can be used to provide the charging current for a similar charge acceptance analysis. For example, a dedicated DC source can be used, such as a DC power supply. This supply could be a controlled or regulated DC supply, or it could be another battery or batteries connected in parallel to the battery under test. Another charging source could be a dedicated battery charger. Another charging source could be any other device that stores electrical energy, such as a capacitor. Yet another charging source could be the charging current from an assist vehicle by means of connected jumper cables.

As mentioned above, it is preferred that the tool can be readily adapted to specific charge acceptance criteria; that is, if a function similar to the equation above is used, the 0.65 factor might be modified to suit. For example, a battery manufacturer might establish criteria that is informed by their design and warranty policy. A different charge acceptance criterion could be set by a car company that is informed by a reliability target and emergency roadside service policy. Another criterion might be set by a battery retail chain and is informed by a desire to meet specific warranty criteria set by the battery manufacturer. A battery service provider, such as a roadside service provider, might prefer yet another criterion. In each of these different cases, the charge acceptance testing can be accomplished by the same physical tools, but the outputted recommendation is determined by the particular current acceptance criteria. In these examples, the car company, the battery manufacturer, the battery retailer, and the battery service provider can be considered "testing authorities", where a testing authority is an entity that has a reason to specify the charge acceptance criteria used by a battery testing tool to test a battery.

According to another aspect of the present invention, the charge acceptance criteria that is used by the tool for a particular test is received as an instruction from the testing authority. The instruction can include details such as how much data is to be gathered, the time intervals over which the data is gathered, and how the data is to be evaluated to determine an outcome. In one embodiment, the information considered in the evaluation includes information such as battery temperature, battery size, battery voltage, battery current, and time elapsed after the beginning of the test. It could include other factors, such as battery type, construction, vehicle details, alternator current limits, or other power supply current limits. The instructions include decision logic such as the functions described above, but may be any other function that the testing authority decides is appropriate for the testing situation.

The instructions can be provided to the testing tool in a number of ways. The instructions can be included as a default when the tool is made, and the instructions can be updated after the tool is made. These instructions are stored in the tool in a memory that can be updated using typical update methods, such as updating by use of a portable stored memory device such as an SD card that can be inserted in the tool, and the instructions then being copied from the SD card to the tool. Alternatively, the instructions can be delivered to the tool by wired or wireless means. If the testing tool is connected to a remote computer, a computer network or the internet by a wired or wireless means, the instructions can be sent to the test tool by these wired or wireless means. Examples of wireless connections include ethernet, WiFi, or Bluetooth, or other radio communication methods. Where the testing tool includes a smart device as described above, the testing instructions can be provided as a part of the testing app, and updated (automatically, or initiated by the user) as required.

In one embodiment, a user of a battery testing tool will be assigned a username. The testing tool will then request the username of the user before testing can commence. When the username is entered into the testing tool, the testing tool will look in its own memory to find instructions to be applied for that particular user. The testing tool may be connected to a remote computer, and when the username is entered into the testing tool, the testing tool communicates with the remote computer and requests instructions that are to be used by the testing tool for tests performed by the user with this particular username.

A testing authority can establish test criteria instructions to be used by a group of users. The testing authority will store these instructions, and a list of usernames to which they apply in a remote computer. These instructions will be provided by the remote computer to the testing tool whenever a user from the specified group enters their username into the test tool.

In one embodiment, there is a server or central computer, referred to as a testing platform controller, configured with software designed for the storage of testing instructions and other testing configuration information useful in battery testing. A testing authority can create an account on this computer system and in this account it can store testing instructions and other configuration information. The testing authority can specify particular users or groups of users who can access these instructions and configurations.

Remote testing tool users will identify themselves to the testing tool, and the testing tool will communicate through some wired or wireless means, typically through an internet connection, with the testing platform controller. The testing platform controller will confirm the identity of the testing tool user, and using typical database lookup means, will find the testing instructions and configuration information for that particular remote testing tool user. The testing instructions and other testing configuration information will be delivered to the testing tool and the testing tool will then be ready to perform the test according to the appropriate testing instructions for that user.

The testing authority at any time can adjust the instructions or other configuration settings, so that each time the testing tool communicates with the testing platform controller, the controller will send updated testing instructions and or configurations. In this way, the testing tool can be used to support many different and custom test criteria as determined by a testing authority. This technique can be applied to tests other than charge acceptance testing as well. Different threshold conditions or algorithms can be used to develop recommendations for other tests related to batteries or other items to be tested.

While a preferred embodiment of the invention has been described in detail, the invention is not to be limited thereby, but only by the following claims.

What is claimed is:

1. A method for testing a battery, comprising the steps of:
   performing a preliminary test to evaluate the state of charge of the battery;
   if the battery is sufficiently charged to be further evaluated, determining a condition of the battery;
   if the battery is insufficiently charged to be further evaluated, applying charging current to the battery;
   measuring the amount of charging current accepted by the battery;
   comparing the amount of charging current accepted by the battery to an expected minimum value for a battery of the type of battery under test in acceptable condition; and
   determining the condition of the battery under test responsive to said comparison step.

2. The method of claim 1, wherein said preliminary test is a measurement of the open-circuit voltage across the terminals of the battery.

3. The method of claim 1, wherein the battery is installed in a vehicle comprising an engine-driven alternator and charging current is applied from the vehicle's alternator.

4. The method of claim 1, wherein said preliminary test is performed by a dedicated device which is connected to the battery, and which transmits test results to a smart device which analyzes the test results and provides an indication of the condition of the battery.

5. The method of claim 4, wherein said dedicated device transmits test results to the smart device optically.

6. The method of claim 5, wherein said dedicated device transmits test results to the smart device optically by display of a QR code representative of test results.

7. The method of claim 4, wherein said dedicated device also performs an ohmic test on the battery, to measure its internal resistance.

8. The method of claim 1, wherein the charging current source is a separate power supply.

9. The method of claim 1, wherein in the step of comparing the amount of charging current accepted by the battery to an expected minimum value for a battery of the type of battery under test in acceptable condition the expected minimum value is determined as a function of voltage.

10. The method of claim 1, wherein in the step of comparing the amount of charging current accepted by the battery to an expected minimum value for a battery of the type of battery under test in acceptable condition the expected minimum value is a function of battery temperature.

11. The method of claim 1, wherein in the step of comparing the amount of charging current accepted by the battery to an expected minimum value for a battery of the type of battery under test in acceptable condition the expected minimum value is a function of time.

12. The method of claim 1, wherein in the step of comparing the amount of charging current accepted by the battery to an expected minimum value for a battery of the type of battery under test in acceptable condition the expected minimum value is a function of change in current over time.

13. The method of claim 1, wherein the method of determining the amount of charging current accepted by the battery is a function of battery type.

14. A method of determining battery condition employing a dedicated device capable of measuring parameters of the battery and a smart device capable of receiving testing instructions from a testing authority, comprising the steps of:
  connecting said dedicated device to the battery;
  employing said dedicated device to measure the open-circuit voltage across the battery;
  communicating the measured open-circuit voltage to the smart device;
  employing the smart device to determine whether the battery is sufficiently charged to be further evaluated;
  if the battery is sufficiently charged to be further evaluated, determining the condition of the battery;
  if the battery is insufficiently charged to be further evaluated, applying charging current to the battery;
  measuring the amount of charging current accepted by the battery;
  employing the smart device to compare the amount of charging current accepted by the battery to a predetermined minimum value of current acceptance for a battery of the type of battery under test in acceptable condition; and
  determining the condition of the battery under test responsive to said comparison step;
  wherein said predetermined minimum value is set by a testing authority, and received by said smart device.

15. The method of claim 14, wherein the predetermined minimum value of current acceptance for a battery of the type of battery under test in acceptable condition is a function of voltage.

16. The method of claim 14, wherein said dedicated device transmits test results to the smart device optically.

17. The method of claim 16, wherein said dedicated device transmits test results to the smart device optically by display of a QR code representative of test results.

18. The method of claim 14, wherein the dedicated device measures the amount of charging current accepted by the battery.

19. The method of claim 14, wherein said dedicated device also performs an ohmic test on the battery, to measure its internal resistance.

20. The method of claim 14, wherein the battery is installed in a vehicle comprising an engine-driven alternator and charging current is applied from the vehicle's alternator.

21. The method of claim 14, wherein the charging current source is a separate power supply.

* * * * *